(12) United States Patent
Arceo De La Pena et al.

(10) Patent No.: US 10,249,512 B2
(45) Date of Patent: Apr. 2, 2019

(54) TUNABLE TIOXNY HARDMASK FOR MULTILAYER PATTERNING

(71) Applicant: INTERNATIONAL BUSINESS MACHINES CORPORATION, Armonk, NY (US)

(72) Inventors: Abraham Arceo De La Pena, Albany, NY (US); Ekmini A. De Silva, Albany, NY (US); Nelson M. Felix, Albany, NY (US); Sivananda K. Kanakasabapathy, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/867,830

(22) Filed: Jan. 11, 2018

(65) Prior Publication Data

US 2018/0197752 A1    Jul. 12, 2018

Related U.S. Application Data

(62) Division of application No. 15/404,375, filed on Jan. 12, 2017, now Pat. No. 9,941,142.

(51) Int. Cl.
*H01L 21/311* (2006.01)
*H01L 21/3213* (2006.01)
(Continued)

(52) U.S. Cl.
CPC ........ *H01L 21/32139* (2013.01); *G03F 7/091* (2013.01); *H01L 21/0276* (2013.01);
(Continued)

(58) Field of Classification Search
CPC .......... H01L 21/32139; H01L 21/0276; H01L 21/02186; H01L 21/32134; H01L 21/02266; H01L 21/76892
See application file for complete search history.

(56) References Cited

U.S. PATENT DOCUMENTS 9,087,876 B2    7/2015  Nguyen et al.
9,159,579 B2   10/2015  Peng et al.
(Continued)

OTHER PUBLICATIONS

List of IBM Patents or Patent Applications Treated as Related; (Appendix P), Date Filed Jan. 11, 2018; 2 pages.
(Continued)

*Primary Examiner* — Anthony Ho
*Assistant Examiner* — Mohammad M Hoque
(74) *Attorney, Agent, or Firm* — Cantor Colburn LLP; David Quinn (57) ABSTRACT

Lithographic multilayer structures are disclosed that generally include an organic planarizing layer and a tunable titanium oxynitride layer on the organic planarizing layer, wherein the titanium oxynitride includes TiOxNy, and wherein x is from 2.5 to 3.5 and y is from 0.75 to 1.25. The lithographic multilayer structure further includes a photosensitive resist layer on the titanium oxynitride layer. The tunable titanium oxynitride is configured to function as a hard mask and as an antireflective coating. Also disclosed are methods for patterning the lithographic multilayer structures.

8 Claims, 6 Drawing Sheets

(51) Int. Cl.
  *H01L 21/027* (2006.01)
  *H01L 21/768* (2006.01)
  *H01L 21/02* (2006.01)
  *G03F 7/09* (2006.01)

(52) U.S. Cl.
  CPC .. *H01L 21/02186* (2013.01); *H01L 21/02266* (2013.01); *H01L 21/32134* (2013.01); *H01L 21/76892* (2013.01)

(56) References Cited

U.S. PATENT DOCUMENTS

| | | | |
|---|---|---|---|
| 2008/0076070 A1 | 3/2008 | Koh et al. | |
| 2009/0181330 A1* | 7/2009 | Gabor | G03F 7/70433 430/322 |
| 2014/0199628 A1* | 7/2014 | Edelstein | G03F 7/094 430/270.1 |
| 2015/0380251 A1* | 12/2015 | Glodde | H01L 21/28123 438/591 |

OTHER PUBLICATIONS

Pending U.S. Appl. No. 15/404,375 entitled "Tunable Tioxny Hardmask for Multilayer Patterning," filed Jan. 12, 2017.

* cited by examiner

TUNABLE TIOXNY HARDMASK FOR MULTILAYER PATTERNING

DOMESTIC PRIORITY

This Application is a DIVISIONAL of U.S. patent application Ser. No. 15/404,375, filed Jan. 12, 2017, the disclosure of which is incorporated by reference herein in its entirety.

BACKGROUND

The present invention generally relates to semiconductor integrated circuits, and more particularly, to multilayer image transfer process employing a TiOxNy hard mask layer and structures for effecting the same.

A trilayer lithography process is an exemplary multilayer patterning scheme known in the art that employs organic/inorganic/organic layers to produce sub ground rule (less than 40 nm) of various structure and features such as gate structures. An organic material layer such as an amorphous carbon layer is often used in order to transfer a composite image of two independent images. An underlying, ultrathin silicon containing layer acts as a hardmask during the etch transfer step. The third layer is typically an organic film. Trilayer processing thus offers the opportunity for a significant reduction in photoresist film thickness and provides a potential solution to the familiar aspect ratio problem encountered during wet development of 193-nm single layer resists.

SUMMARY

Disclosed herein are multilayer lithographic structures, and methods of forming a patterned substrate.

In one or more embodiments, a multilayer lithographic structure includes an organic planarizing layer, a titanium oxynitride layer on the organic planarizing layer, and a photosensitive resist layer on the titanium oxynitride layer. The titanium oxynitride is of the formula TiOxNy, wherein x is from 2.5 to 3.5 and y is from 0.75 to 1.25.

In one or more embodiments, a method of forming a patterned structure includes forming a vertical stack on a substrate including a conformal metal layer. The vertical stack includes an organic planarizing layer, a titanium oxynitride layer on the organic planarizing layer, and a patterned photosensitive resist layer on the titanium oxynitride layer. The titanium oxynitride layer is of the formula TiOxNy, wherein x is from 2.5 to 3.5 and y is from 0.75 to 1.25. The patterned photosensitive layer exposes a portion of the titanium oxynitride layer. The exposed portion of the titanium oxynitride layer is etched to expose a portion of the organic planarizing layer. The exposed portion of the organic planarizing layer is dry etched to the substrate to expose at a least a portion of the conformal metal layer. A remaining portion of the titanium oxynitride layer is subjected to wet stripping wherein the wet stripping removes the exposed portion of the conformal metal layer. A remaining portion of the organic planarizing layer is dry etched to expose a remaining portion of the conformal metal layer.

In one or more other embodiments, a method of forming a patterned structure includes forming a vertical stack on a substrate including a conformal metal layer. The vertical stack includes an organic planarizing layer, a titanium oxynitride layer on the organic planarizing layer, and a patterned photosensitive resist layer on the titanium oxynitride layer. The titanium oxynitride layer has an extinction coefficient less than 1.0 over a wavelength range from 400 nm to 800 nm and has an etch rate greater than 2 nm per minute in a wet etch solution comprising ammonium hydroxide, hydrogen peroxide and water at a temperature of 20° C. The patterned photosensitive layer exposes a portion of the titanium oxynitride layer. The exposed portion of the titanium oxynitride layer is etched to expose a portion of the organic planarizing layer. The exposed portion of the organic planarizing layer is dry etched to the substrate to expose at a least a portion of the conformal metal layer. A remaining portion of the titanium oxynitride layer is subjected to wet stripping, wherein the wet stripping removes the exposed portion of the conformal metal layer. A remaining portion of the organic planarizing layer is dry etched to expose a remaining portion of the conformal metal layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

A multi-layer lithographic structure and process in accordance with embodiments of the invention generally include deposition of a planarization layer onto a substrate, which can have a planar or non-planar surface depending on the structural features therein, deposition of a tunable $TiO_xN_y$ hardmask layer formed on the planarization layer, and deposition of a photosensitive resist layer on the tunable $TiO_xN_y$ hardmask layer. Optionally, a bottom anti-reflective coating (BARC) can be deposited intermediate the $TiO_xN_y$ layer and the planarization layer to improve the profile of the photosensitive resist layer when patterned. As will be discussed in greater detail herein, the composition of the tunable $TiO_xN_y$ layer can be selectively varied to provide an effective hardmask that can be readily removed by wet etching while also providing effective antireflective properties for patterning of the photosensitive resist layer.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Figure 1:
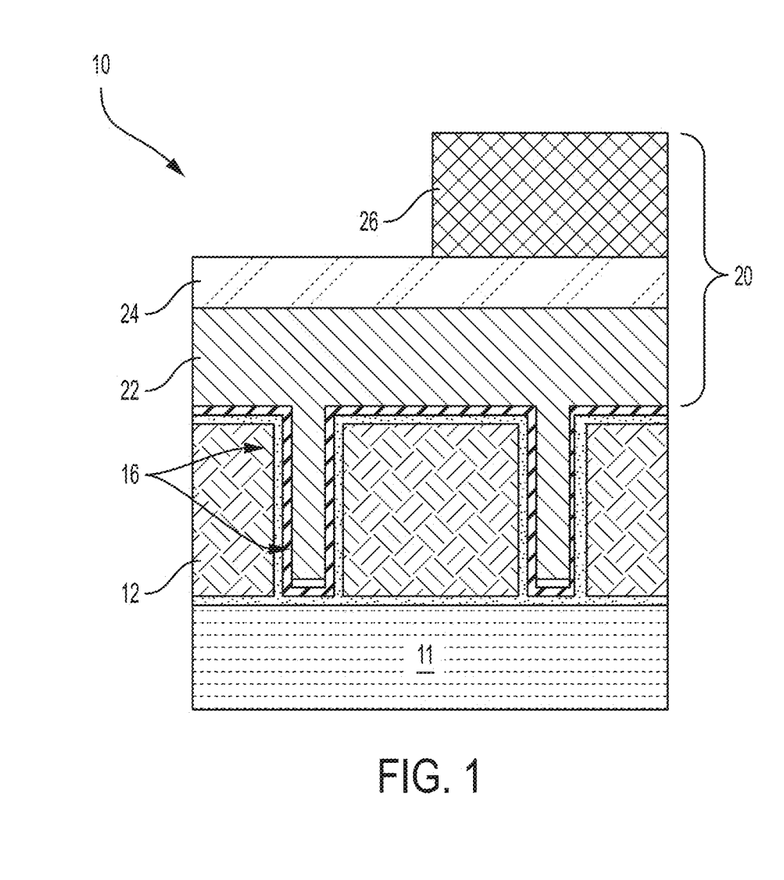
FIG. 1 depicts a portion of a semiconductor substrate including a trilayer lithographic structure overlaying a patterned interlayer dielectric layer including a conformal metal liner layer, wherein the photosensitive resist layer is patterned to selectively expose a portion of an underlying titanium oxynitride layer in accordance with one or more embodiments.

Turning now to a more detailed description of embodiments of the present invention, FIG. 1 depicts a cross-sectional view of a semiconductor structure 10 including a trilayer lithographic structure 20. The semiconductor structure 10 can include a semiconductor substrate 11 including any semiconducting material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) as well as bulk semiconductor substrates are also contemplated herein. Typically, the semiconductor substrate is a Si-containing semiconductor such as, for example, Si, SiC, SiGe, SiGeC, or a silicon-on-insulator. The substrate can be unstrained, strained or include regions of strain and unstrain therein. The substrate can be intrinsic or it can be doped with, for example, but not limited to: B, As or P.

When SOI substrates are employed, those substrates include a top semiconductor layer and a bottom semiconductor layer that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

An interlayer dielectric 12 can be formed overlying the semiconductor substrate 10. Interlayer dielectric layer 12 can be one of a number of different dielectric materials commonly used in integrated circuit fabrication. For example, dielectric layer 12 can be silicon dioxide, silicon nitride, or a doped glass layer, such as phosphorus silicate glass, boron silicate glass, and the like. In other embodiments, the dielectric layer can be a low k dielectric layer, wherein low k generally refers to materials having a dielectric constant less than silicon dioxide. Exemplary low k dielectric materials include, without limitation, SiLK® from Dow Chemical, Coral® from Novellus, Black Diamond® from Applied Materials, and spin on dielectrics can be used. Coral® can be described generically as a SiCOH dielectric. Depending upon the particular dielectric material, dielectric layer 12 can be formed by chemical vapor deposition deposited (CVD), plasma enhanced chemical vapor deposition (PECVD), atmospheric deposition as well as spin on techniques. In one or more embodiments, dielectric layer 12 is a chemical vapor deposited material, such as silicon dioxide or silicon nitride, which has been deposited over a planarized dielectric layer.

Once the dielectric layer 12 has been deposited, openings 14 such as trench and/or via features are next photolithographically patterned into the dielectric layer 12 as shown. Photolithography can include forming a trilayer of organic dielectric layer (ODL), inorganic anti reflective coating (SiARC), and a photoresist (not shown) onto at least the dielectric surfaces where openings are desired, exposing the photoresist to a pattern of activating radiation, and then developing the exposed photoresist with a resist developer to provide a patterned photoresist. At least one etch process can be employed to transfer the pattern from the patterned photoresist into the dielectric layer 12 and form the opening. The etching process can be a dry etch (e.g., reactive ion etching, plasma etching, ion beam etching, or laser ablation) and/or a wet chemical etch (e.g., potassium hydroxide (KOH)). After transferring the pattern, the patterned photoresist is removed utilizing resist stripping processes, for example, ashing.

A conformal metal liner layer 16, i.e., barrier layer, can then conformally deposited to the patterned dielectric layer 12. For example, tantalum, tantalum nitride, cobalt, ruthenium, titanium nitride, and combinations of more than one material (for example tantalum nitride/tantalum or tantalum nitride/cobalt).

The trilayer lithographic structure 20 can be deposited over the non-planar interlayer dielectric 12 and conformal metal liner layer 16. The lithographic structure 20 includes an organic planarization layer 22, a tunable titanium oxynitride layer 24 overlying the organic planarization layer 22, and a photosensitive resist layer 24 overlying the tunable titanium oxynitride layer 26. Alternatively, the lithographic structure 20 can include a bottom antireflective coated layer (BARC) (not shown) intermediate the tunable titanium oxynitride layer 24 and the planarization layer 22 so as to form a quad layer lithographic structure.

The lithographic structure 20 (i.e., layers 22, 24, and 26) can provide greater transparency than conventional trilayer lithographic material stacks that employ a titanium nitride layer, which has an extinction coefficient (k) greater than 1.0 at wavelengths from 400 nm to 800 nm. The extinction coefficient of the titanium oxynitride material can be tuned to provide an extinction coefficient (k) markedly less than that of titanium nitride over the same spectrum, e.g., less than 1.0 at wavelengths from 400 nm to 800 nm. Further, the titanium oxynitride layers can provide substantially the same or better etch selectivity to the etch chemistry employed to remove organic planarization material. Thus, the lithographic structure can provide superior overlay performance in lithographic processes compared to other structures.

The planarization layer 22, e.g., an organic planarization layer (OPL), which can also be referred to as an underlayer, is first deposited on the metal liner layer 16 and interlayer dielectric layer 12 overlaying the substrate 10. The planarization layer 22 can be a polymer including carbon, hydrogen, oxygen, and optionally nitrogen, fluorine, and silicon. In one or more embodiments, the planarization layer 22 is a polymer with sufficiently low viscosity so that the top surface of the applied polymer forms a planar horizontal surface. The planarization layer, which can be a spin-deposited layer, can be baked at an elevated temperature to cure the planarization layer, if needed, and reflow its top surface into a substantially planar form. The thickness of the planarization layer is about 50 nanometers to about 300 nanometers (nm), although lesser and greater thicknesses can also be employed.

A thin hard mask layer 24 of the tunable titanium oxynitride is deposited onto the planarization layer 22. The tunable titanium oxynitride layer 24 can be configured to exhibit the favorable properties of titanium dioxide (TiO$_2$), which has low absorbance in the ultraviolet wavelength region, along with the high wet strippability of titanium nitride (TiN) for multi-layer patterning applications such as trilayer or optional quad layer patterning (including BARC layer intermediate the planarization layer and the titanium oxynitride layer) at imaging wavelengths of 193 nm, for example, or less.

As will be discussed in greater detail below, the titanium oxynitride material in the hard mask layer has a composition of TiO$_x$N$_y$, in which x can be in a range from 2.5 to 3.5 and y can be in a range from 0.75 to 1.25. The foregoing titanium oxynitride compositions has been found to provide wet etch rates of about 2 to about 18 nanometer per minute or more in SC-1 wet etchant compositions and have a k value in the range of 0 to about 1.5 in the wavelength range of 400 nm to 800 nm. Because of this, good patterning profile of the photosensitive resist layer can be provided with no observable footing due to resist poisoning. The thickness of the titanium oxynitride layer is about 3 nm to about 50 nm, although lesser and greater thicknesses can also be employed.

The tunable titanium oxynitride layer 24 can be formed, for example, by reactive sputtering such as by direct current (DC) magnetron sputtering of a pure titanium metal target in a controlled nitrogen and oxygen ambient environment. Nitrogen and/or oxygen flow rate during deposition can be varied to provide the desired variations in stoichiometry. XPS spectra has confirmed the intermediate characteristics of the titanium oxynitride films when compared to titanium dioxide and titanium nitride. In one or more embodiments, the extinction coefficient (k) of the titanium oxynitride is less than 1 from a wavelength range of 400 nm to 800 nm. In other embodiments, the extinction coefficient (k) of the titanium oxynitride is less than 0.5 from a wavelength range of 400 nm to 800 nm.

Table 1 demonstrates different compositions of TiOxNy with varying compositions of nitrogen and oxygen obtainable by reactive sputtering of a pure titanium metal target in a controlled nitrogen and oxygen ambient environment. For the nitrogen containing films, the flow rate of nitrogen into the sputtering chamber was at 100 standard cubic centimeters per minute (sccm) whereas the oxygen flow rates were varied as shown.

TABLE 1

|  | N$_2$/O$_2$ flow rate (sccm) | Ti—Ti (Atomic %) | TiN (Atomic %) | Ti—O (Atomic %) | Ti (Atomic %) | O (Atomic %) | N (Atomic %) | TiN:TiO ratio |
|---|---|---|---|---|---|---|---|---|
| TiN | 100/0 | 0.112 | 15.368 | 19.14 | 34.621 | 25.66 | 32.203 | 0.802883 |
| TiON | 100/10 | 0.099 | 14.09 | 20.62 | 34.809 | 30.09 | 28.373 | 0.683317 |
| TiON | 100/20 | 0.005 | 4.01 | 28.29 | 32.305 | 46.36 | 15.36 | 0.141746 |
| TiON | 100/30 | 0.248 | 0.619 | 35.44 | 36.307 | 54.64 | 3.84 | 0.017466 |
| TiON | 100/50 | 0.020 | 0.539 | 36.16 | 36.729 | 57.24 | 2.98 | 0.149059 |
| TiOx | 0/100 | 0.007 | 0.207 | 30.32 | 30.435 | 62.415 | 0.613 | 0.006826 |

Though TiN has desirable etch resistant properties, it is not suitable as a patterning hardmask in the trilayer or even quadlayer lithographic structures for several reasons including, among others, resist poisoning, and high absorbance in the UV wavelength range. In semiconductor manufacturing, patterning of a dielectric material layer to form via trenches and line trenches is necessary to form metal interconnect structures. Titanium nitride (TiN) hard mask layer consisting of titanium and nitrogen is frequently employed as a hard mask layer during the patterning process. Unfortunately, removal of a TiN hard mask layer cannot be easily performed without causing collateral damages.

Likewise, titanium dioxide is not suitable as a patterning hardmask in the trilayer or quadlayer lithographic structures for several reasons including, among others, its etch resistance.

A photosensitive resist layer 26 is deposited onto the tuned titanium oxynitride layer 24 and lithographically patterned to expose selected portions of the titanium oxynitride layer 24. The photosensitive layer 26 is at a thickness of 30 nm to 300 nm, although lesser and greater thicknesses can also be employed.

The photosensitive resist layer 26 can be formed using conventional deposition techniques such chemical vapor deposition, plasma vapor deposition, sputtering, dip coating, spin-on coating, brushing, spraying and other like deposition techniques can be employed. Following formation of the photosensitive resist layer, the photosensitive resist layer is exposed to a desired pattern of radiation such as 193 nm, X-ray radiation, extreme ultraviolet (EUV) radiation, electron beam radiation or the like. Illustrative examples of 193 nm photosensitive resist layers include a methacrylate polymer, a phenolic based polymer or a copolymer thereof. Other types of organic photoresists such as, for example, polyesters can also be employed. Next, the exposed photosensitive resist layer is developed utilizing a conventional resist development process to expose selected portions of the tunable titanium oxynitride layer 24 as shown.

The optional BARC layer (not shown) in a quadlayer lithographic structure can be used to improve the imaging profile of the photosensitive resist layer as can be desired in some applications. The thickness of the BARC layer in these applications can be from 10 nm to 60 nm, although less or greater thicknesses can be used.

Figure 2:
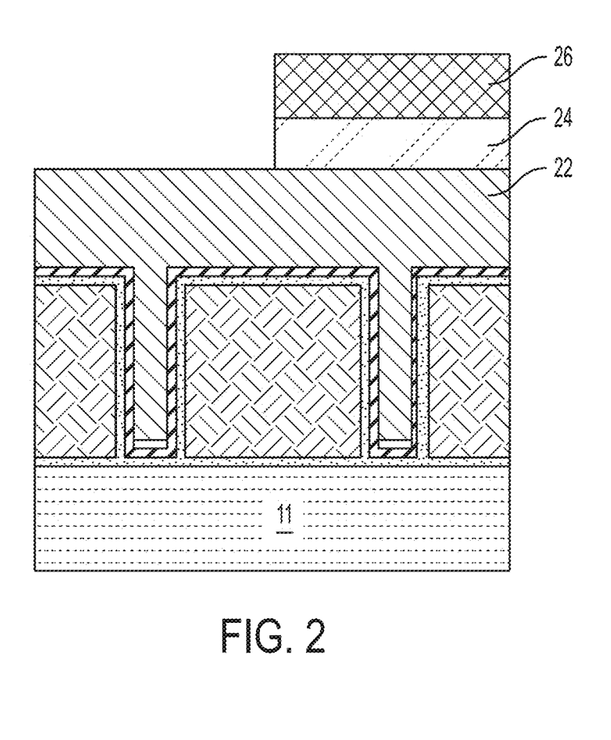
FIG. 2 depicts the semiconductor substrate following a wet etch process to remove the exposed portion of the underlying titanium oxynitride layer.

Referring now to FIG. 2, after the development step, an etching step can be performed to transfer the pattern from the patterned photosensitive resist layer 26 into the tunable titanium oxynitride layer 24. The etching step used in forming the at least one opening can include a dry etching process (including, for example, reactive ion etching, ion beam etching, plasma etching or laser ablation), a wet chemical etching process or any combination thereof. A portion of the photosensitive resist layer 26 can also be removed during the etching process.

Figure 3:
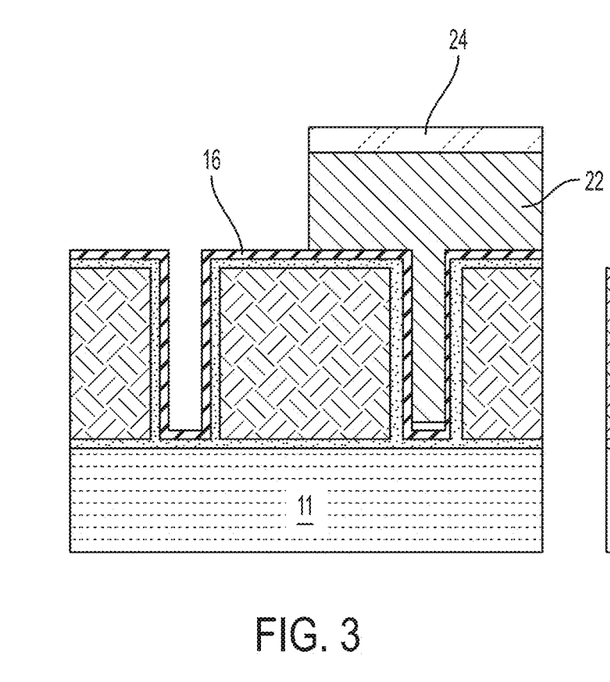
FIG. 3 depicts the semiconductor substrate following a dry etch process to remove an exposed portion of a underlying organic planarization layer.

In FIG. 3, the exposed planarization layer 16 is anisotropically etched to the metal barrier layer 16 utilizing a dry etch process, e.g., reactive ion etch using, for example, $CF_4$ based chemistry. The dry etch process is selective to the planarization layer 16, wherein the tunable titanium oxynitride layer 24 has a markedly lower etch rate.

Figure 4:
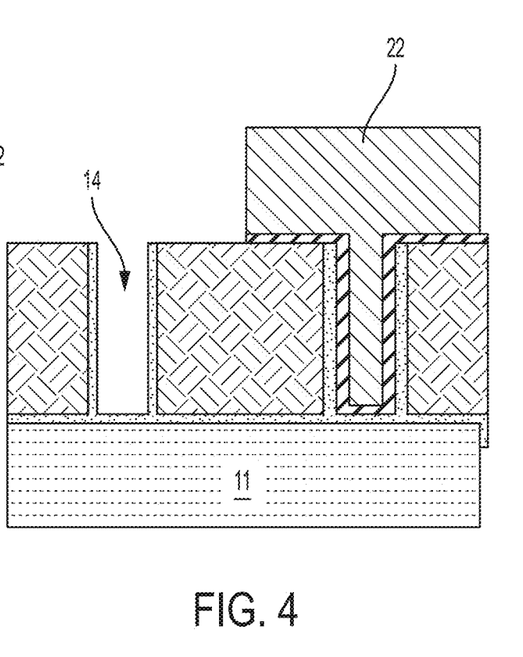
FIG. 4 depicts the semiconductor substrate following a wet etch process to remove a remaining portion of the underlying titanium oxynitride layer.

In FIG. 4, the substrate is subjected to a wet etch to selectively remove the tunable titanium oxynitride layer 24 from the organic planarization layer 22. An exemplary wet etch is a standard clean wet etching process referred to by those skilled in the art as SC-1, which utilizes an aqueous solution including ammonium hydroxide, hydrogen peroxide, and water, which is typically removed for metallic contamination removal. The ratio of $NH_4OH:H_2O_2:H_2O$ is typically 1:2:10, respectively. Advantageously, the wet strippability of the tunable titanium oxynitride layer in the SC-1 wet etchant does so without damaging the substrate and without the need for a dry etch process.

The substrate is exposed to the wet etchant for a period of time (typically, about 0.5 minutes to about 30 minutes) and at a temperature (about 25° C. to about 70° C.) effective to etch the titanium nitride selectively relative to the surrounding structures.

Figure 5:
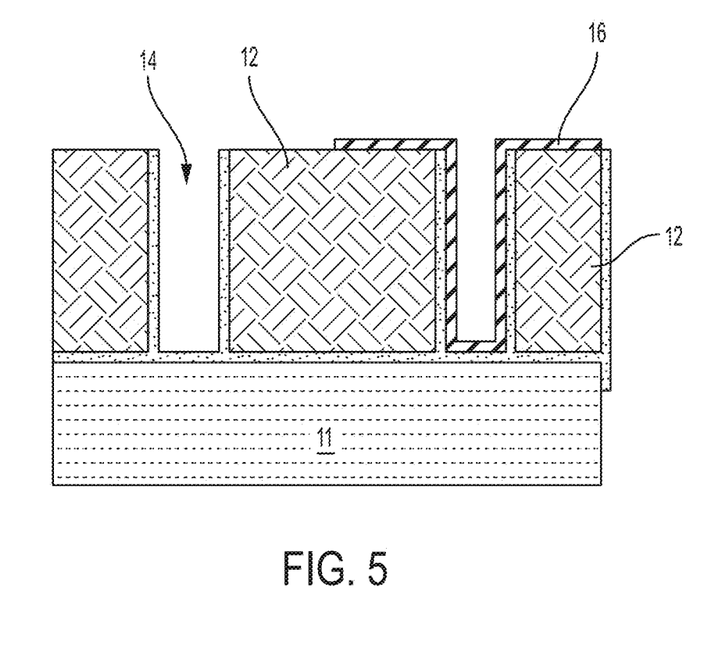
FIG. 5 depicts the semiconductor substrate following a dry etch process to remove a remaining portion of a underlying organic planarization layer.

In FIG. 5, the remaining organic planarizing layer 22 is removed by the dry etch process as discussed in FIG. 3.

The following examples are given to illustrate the scope of aspects of the present invention. Because these examples are given for illustrative purposes only, the invention embodied therein should not be limited thereto.

Example 1

In this example, a titanium nitride film, a titanium dioxide film and various titanium oxynitride films were subjected to a SC-1 ($NH_4OH:2H_2O_2:10H_2O$) wet etch at room temperature. Fresh solutions are used for each test and included immersion for a period of 25 minutes at room temperature. The films were deposited by reactive sputtering using a pure titanium target in a controlled atmosphere by flowing nitrogen and/or oxygen gases into the sputtering chamber. The gas flows, resulting film type, and etching results are shown in Table 2.

As shown above, wet strippability by immersion in SC-1 of the titanium oxynitride films ranged from 0.49 to 17.62 nm/min indicating that the titanium oxynitride films can be readily tuned to provide an etching rate about the same as or equal to or increased relative to that of TiN, which is known for its high wet strippability albeit not suitable for a patterning hard mask because of its high UV absorbency. In contrast, as oxygen content increased in the titanium oxynitride films, the etch rate markedly decreased, wherein at an oxygen flow rate of 50 sccm the resulting titanium oxynitride film had an etch rate in the SC-1 solution about twice that of $TiO_2$. For titanium oxynitride films with an oxygen composition resulting from a flow rate of less than 20 sccm, the wet strippability was comparable to titanium nitride.

Example 2

Figure 6:
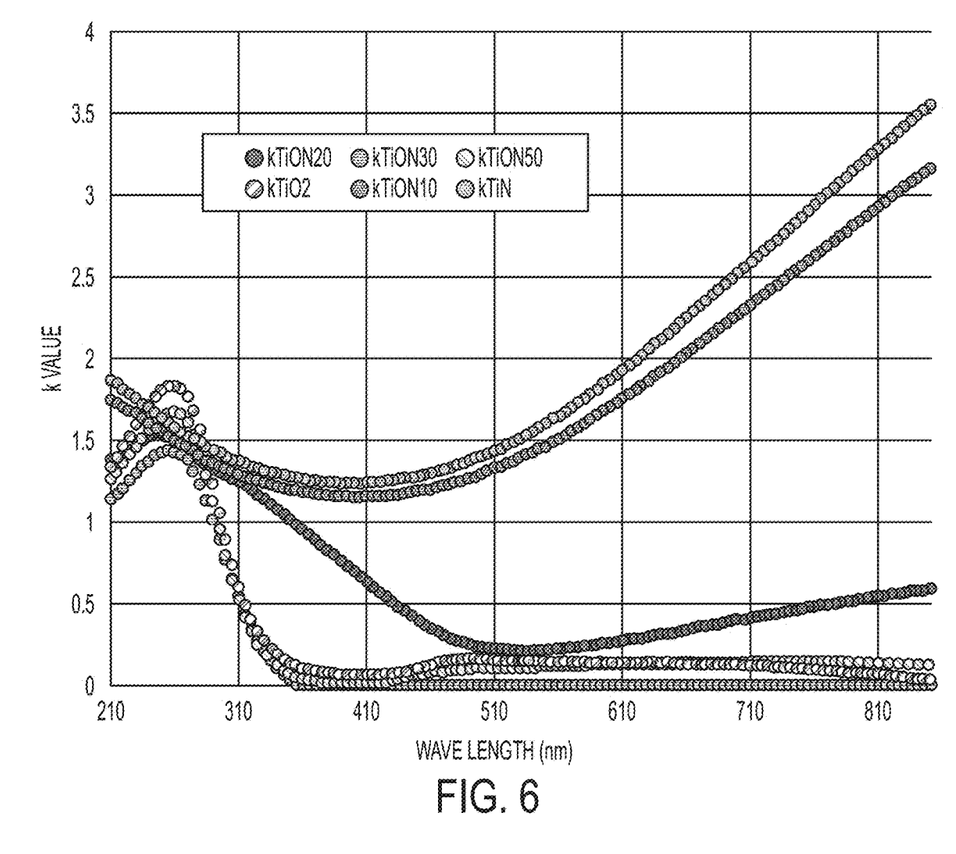
FIG. 6 graphically illustrates extinction coefficient (k) values as a function of wavelength range from about 210 nm to 810 nm for various titanium oxynitride films relative to titanium nitride and titanium dioxide films.

In this example, the absorbency (k value) was measured over a wavelength range of about 210 to about 810 nm for a titanium nitride film, titanium oxynitride films with varying oxygen content, and for a titanium dioxide film. The results are shown in FIG. 6.

As shown, the absorbency shows that having a titanium oxynitride film with an oxygen composition resulting from a flow rate greater than 10 sccm produced a lower absorbance compared to titanium nitride. At oxygen flow rates greater than 20, the extinction coefficient (k) was comparable to titanium dioxide.

Example 3

Figure 7:
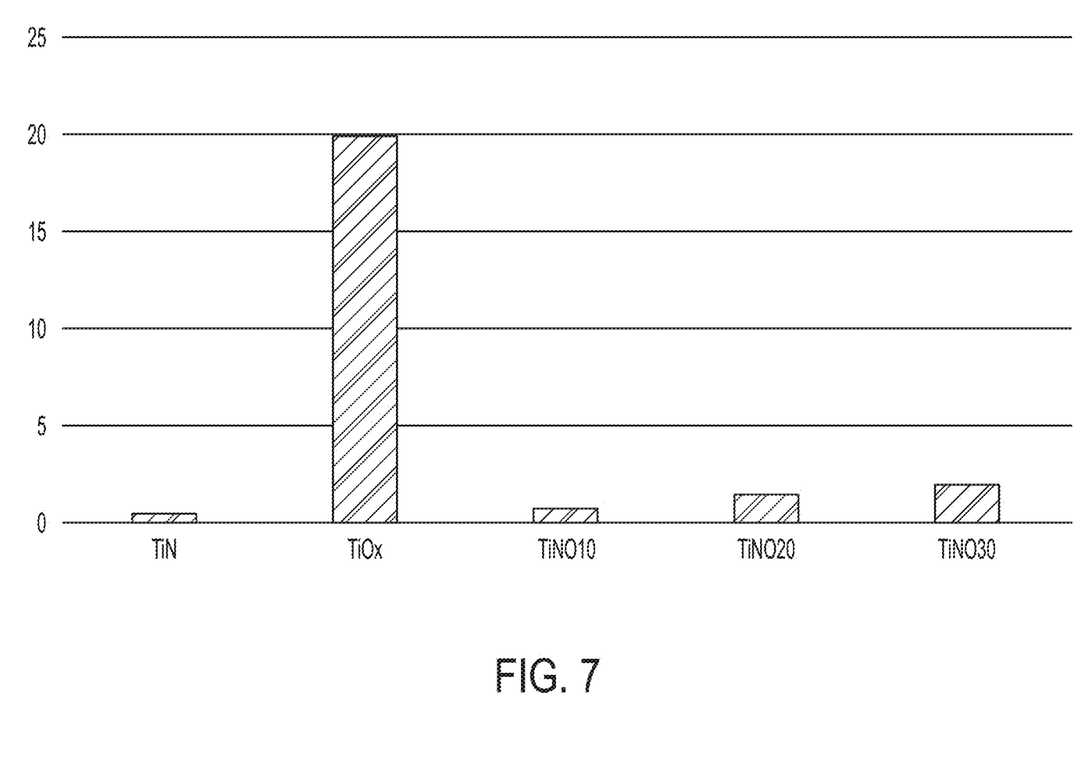
FIG. 7 graphically illustrates film thickness removed for a dry etch process based on $CF_4$ chemistry for various titanium oxynitride films relative to titanium nitride and titanium dioxide films.

In this example, the plasma etch rate based on $CF_4$ etch chemistry for a titanium nitride film, titanium oxynitride films with varying oxygen content, and for a titanium dioxide film was determined. The results are shown in FIG. 7. Advantageously, incorporating a certain percentage of oxygen in the titanium oxynitride films did not sacrifice the dry etching rate. As shown, the dry etch rate for the titanium oxynitride films with an oxygen composition resulting from a flow rate of less than 30 sccm was comparable to titanium nitride at about 1 to about 2 Angstroms per minute. In contrast, the titanium dioxide film was markedly higher at about 20 Angstroms per minute.

Example 4

Figure 8:
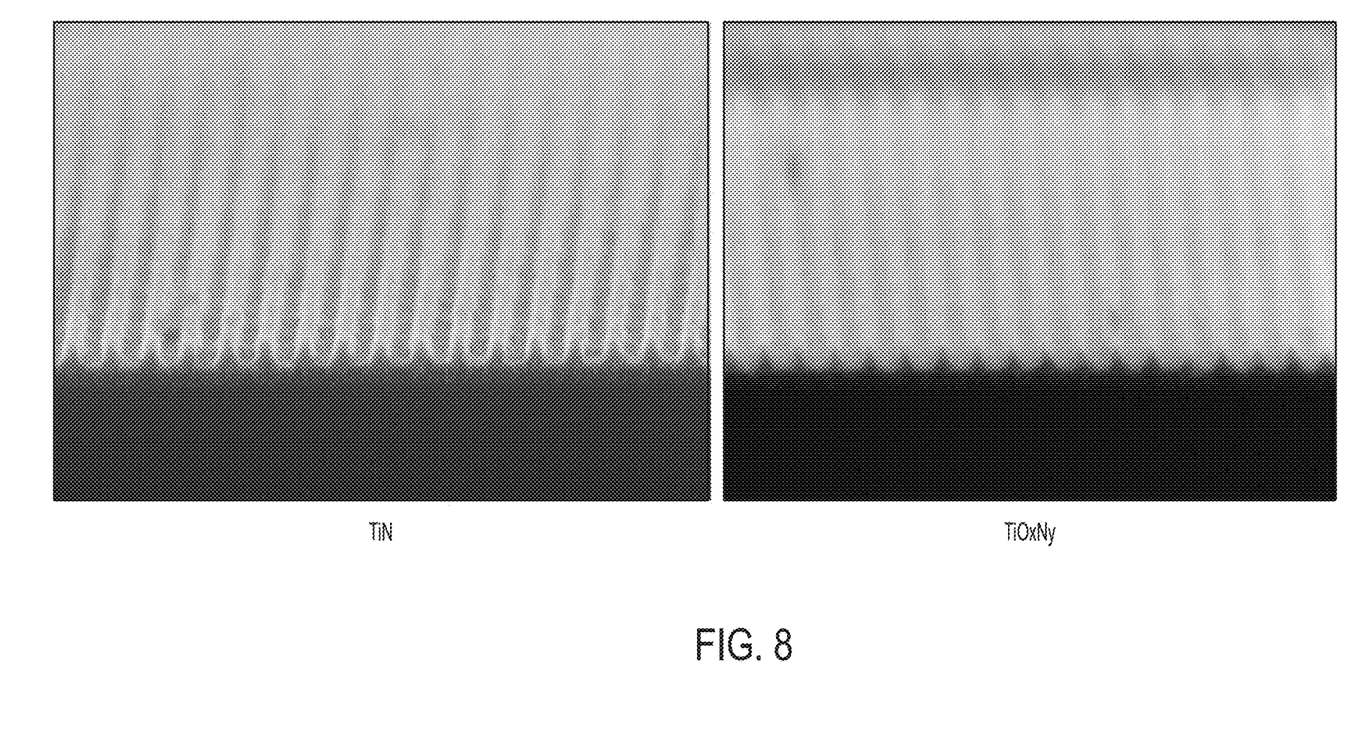
FIG. 8 illustrates micrographs of patterned lines and spaces on titanium nitride film and a titanium oxynitride film.

In this example, a photosensitive EUV resist material, i.e. an EUV photoresist, was patterned on a substrate including titanium nitride layer and a substrate including titanium oxynitride layer deposited by reactive sputtering using titanium as a sputter target. The patterned photoresist was of a 13.5 nanometer line and space pattern formed using a NXE3300B (0.33 NA) EUV scanner commercially available from ASML. FIG. 8 provides scanning electron images

TABLE 2

| | $N_2$ Flow (sccm) | $O_2$ Flow (sccm) | Film Type | Thickness as deposited (nm) | Remaining Thickness after SC-1 Wet Etch for 25 min at RT (nm) | Etch Rate (nm/min) |
|---|---|---|---|---|---|---|
| Control | 100 | 0 | TiN | 498.85 | 25.1 | 18.95 |
| Control | 0 | 100 | $TiO_2$ | 350.1 | 343.0 | 0.28 |
| 1 | 100 | 10 | TiON(10) | 313.2 | 21.7 | 11.66 |
| 2 | 100 | 20 | TiON(20) | 463.1 | 22.5 | 17.62 |
| 3 | 100 | 30 | TiON(30) | 295.7 | 252.2 | 1.72 |
| 4 | 100 | 50 | TiON(50) | 389.1 | 376.8 | 0.49 | illustrating the resist profile on each respective layer. As shown, scumming is evident on the titanium nitride layer whereas scumming is not present for the photoresist patterned on the titanium oxynitride layer.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A multilayer lithographic structure comprising
an organic planarizing layer;
a titanium oxynitride layer on the organic planarizing layer, wherein the titanium oxynitride layer has an extinction coefficient less than 1.0 over a wavelength range from 400 nm to 800 nm and is configured to have an etch rate greater than 2 nm per minute in a wet etch solution comprising ammonium hydroxide, hydrogen peroxide and water at a temperature of 20° C.; and
a photosensitive resist layer on the titanium oxynitride layer.

2. The multilayer lithographic structure of claim 1, wherein the titanium oxynitride comprises $TiO_xN_y$, wherein x is from 2.5 to 3.5 and y is from 0.75 to 1.25.

3. The multilayer lithographic structure of claim 1, wherein the titanium oxynitride layer is selected to have an extinction coefficient (k) less than 0.5 from a wavelength range from 400 nm to 800 nm.

4. The multilayer lithographic structure of claim 1, wherein the organic planarizing layer has a thickness from 50 nm to 300 nm, the titanium oxynitride layer has a thickness of 3 nm to 50 nm, and the photosensitive resist layer has a thickness of 30 nm to 300 nm.

5. The multilayer lithographic structure of claim 1, further comprising a bottom antireflective layer intermediate the titanium oxynitride layer and the organic planarizing layer.

6. The multilayer lithographic structure of claim 1, wherein the photosensitive resist layer is a methacrylate polymer, a phenolic based polymer or a copolymer thereof.

7. The multilayer lithographic structure of claim 1, wherein the photosensitive resist layer is an EUV photosensitive resist.

8. The multilayer lithographic structure of claim 1, wherein the organic planarization layer is a polymer.

* * * * *